United States Patent
Lee et al.

(10) Patent No.: US 10,176,775 B2
(45) Date of Patent: Jan. 8, 2019

(54) DISPLAY DEVICE

(71) Applicant: LG Display Co., Ltd., Seoul (KR)

(72) Inventors: Jung-Hyun Lee, Gyeonggi-do (KR); Tae-Woong Moon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 6 days.

(21) Appl. No.: 15/392,097

(22) Filed: Dec. 28, 2016

(65) Prior Publication Data

US 2017/0193939 A1 Jul. 6, 2017

(30) Foreign Application Priority Data

Dec. 30, 2015 (KR) ........................ 10-2015-0190179

(51) Int. Cl.
*G11C 19/00* (2006.01)
*G09G 3/36* (2006.01)

(52) U.S. Cl.
CPC ......... *G09G 3/3648* (2013.01); *G09G 3/3677* (2013.01); *G11C 19/00* (2013.01); *G09G 2300/0408* (2013.01); *G09G 2300/0426* (2013.01); *G09G 2300/0465* (2013.01); *G09G 2310/0286* (2013.01); *G09G 2310/08* (2013.01)

(58) Field of Classification Search
CPC .............................................. G09G 2310/0286
See application file for complete search history.

(56) References Cited

U.S. PATENT DOCUMENTS

| 7,746,298 | B2 | 6/2010 | Shin |
| 8,605,029 | B2 | 12/2013 | Ohhashi |
| 9,099,053 | B2 | 8/2015 | Matsumoto et al. |
| 9,653,494 | B2 | 5/2017 | Jin |
| 2005/0253791 | A1 | 11/2005 | Shin |
| 2008/0079685 | A1 | 4/2008 | Umezaki et al. |
| 2011/0205212 | A1 | 8/2011 | Matsumoto et al. |
| 2012/0049184 | A1 | 3/2012 | Umezaki et al. |

(Continued)

FOREIGN PATENT DOCUMENTS

| CN | 104849928 A | * | 8/2015 | ......... H01L 27/1255 |
| CN | 104849928 A | | 8/2015 | |

(Continued)

OTHER PUBLICATIONS

Notice of Reason for Refusal for a counterpart Japanese Patent Application No. 2016-254586 dated Oct. 3, 2017.

(Continued)

*Primary Examiner* — Priyank J Shah

(74) *Attorney, Agent, or Firm* — Morgan, Lewis & Bockius LLP

(57) ABSTRACT

A disclosed display device comprises a display panel having a display area configured to display an image. The display panel includes in the display area a plurality of data lines extending in a first direction, a plurality of gate lines extending in a second direction and crossing the data lines, and a plurality of pixels defined by the data lines and the gate lines, and arranged in a plurality of rows and a plurality of columns. The display device further comprises at least one gate in panel (GIP) circuit disposed in the display area and having a plurality of signal lines and a plurality of transistors each respectively disposed between two adjacent columns of the pixels among the columns.

20 Claims, 5 Drawing Sheets

(56) References Cited

U.S. PATENT DOCUMENTS

| | | | |
|---|---|---|---|
| 2012/0098804 A1 | 4/2012 | Ohhashi | |
| 2013/0321499 A1* | 12/2013 | Park | G09G 3/3611 |
| | | | 345/698 |
| 2014/0043306 A1* | 2/2014 | Min | G09G 3/3685 |
| | | | 345/204 |
| 2015/0293546 A1* | 10/2015 | Tanaka | G02F 1/1368 |
| | | | 327/541 |
| 2016/0307937 A1* | 10/2016 | Jin | H01L 27/1255 |
| 2017/0047032 A1* | 2/2017 | Nishiyama | G02F 1/133 |
| 2017/0047033 A1* | 2/2017 | Tanaka | G02F 1/133 |
| 2017/0047034 A1* | 2/2017 | Nishiyama | G09G 3/20 |
| 2017/0047038 A1* | 2/2017 | Noma | G02F 1/1368 |
| 2017/0076683 A1* | 3/2017 | Lee | G11C 19/28 |
| 2017/0255074 A1* | 9/2017 | Nishiyama | G02F 1/1368 |
| 2017/0261828 A1* | 9/2017 | Noma | G02F 1/1368 |
| 2017/0276982 A1* | 9/2017 | Nakanishi | G09F 9/30 |
| 2018/0011504 A1* | 1/2018 | Tanaka | G02F 1/1368 |

FOREIGN PATENT DOCUMENTS

| | | |
|---|---|---|
| EP | 1492078 A2 | 12/2004 |
| JP | H08212188 A | 8/1996 |
| JP | 2005326852 A | 11/2005 |
| JP | 2008089915 A | 4/2008 |
| JP | 2011170300 A | 9/2011 |
| JP | WO2010150574 A1 | 12/2012 |

OTHER PUBLICATIONS

European Search Report dated Jun. 19, 2017 for the corresponding European patent application No. 16207554.3.
Japanese Office Action, dated Apr. 3, 2018, for the counterpart Japanese patent application No. 2016-254586.

* cited by examiner

DISPLAY DEVICE

CROSS-REFERENCE TO RELATED APPLICATION

The present invention claims the benefit of Korean Patent Application No. 10-2015-0190179 filed in the Republic of Korea on Dec. 30, 2015, which is hereby incorporated by reference in its entirety.

BACKGROUND

Field of the Disclosure

The present disclosure relates to a display device, and more particularly, to a display device having a narrow bezel.

Discussion of the Related Art

A display device, such as a liquid crystal display (LCD) device, typically includes a display panel, a data driving circuit for providing data signals to data lines of the display panel, a gate driving circuit for providing gate signals to gate lines of the display panel, and a timing controller for controlling the data driving circuit and the gate driving circuit.

In a typical LCD device, the gate driving circuit and the data driving circuit may be in an integrated circuit form and attached to the display panel in a TCP (tape carrier package) or COF (chip on film) form.

Therefore, as the number of components increases, and manufacturing processes and costs also rise due to an increase in the number of components, it may be more difficult to decrease the weight and size of the LCD device. To solve this problem, a GIP (gate in panel) type LCD device, in which the gate driving unit is formed in the display panel, has been suggested.

FIG. 1 is a plan view of a display panel of a related art GIP type LCD device. As shown in FIG. 1, a display panel 10 of the related art GIP type LCD device includes a display area AA and non-display areas NAA. The non-display areas NAA are disposed at outer sides of the display area AA, for example, at left and right sides of the display area AA, respectively.

Here, pixels P defined by gate lines GL and data lines DL crossing each other are disposed in the display area AA of the display panel 10, and GIP circuits each including signal lines (not shown) and transistors (not shown) are disposed in the respective non-display areas NAA.

As part of developing lighter and thinner LCD devices for use in final products like monitors or TVs with slimmer designs, efforts have been made to narrow the bezel, which is defined as a width of a non-display area NAA. However, as stated above, in the related art GIP type LCD device, since the GIP circuits GIP each having the signal lines (not shown) and the transistors (not shown) are formed in the non-display areas NAA at left and right sides of the display area AA, respectively, there is a limitation on narrowing the bezel.

SUMMARY

Accordingly, the present disclosure is directed to display device that substantially obviates one or more of the problems due to limitations and disadvantages of the related art.

An object of the present disclosure is to provide a display device that has a narrow bezel by disposing signal lines and transistors of GIP circuits within a display area of a display panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present disclosure, as embodied and broadly described herein, a display device comprises: a display panel including a display area and a non-display area, the display panel including in the display area m/2 data lines extending in a first direction, m being a positive even number, 2n gate lines extending in a second direction and crossing the data lines, n being an integer greater than or equal to 5, and a plurality of pixels defined by the data lines and the gate lines, and arranged in n rows and m columns; and at least one gate in panel (GIP) circuit disposed in the display area and having a plurality of signal lines and a plurality of transistors each respectively disposed between two adjacent columns of the pixels among the m columns.

In another aspect, a display device comprises: a display panel having a display area configured to display an image, the display panel including in the display area a plurality of data lines extending in a first direction, a plurality of gate lines extending in a second direction and crossing the data lines, and a plurality of pixels defined by the data lines and the gate lines, and arranged in a plurality of rows and a plurality of columns; and at least one gate in panel (GIP) circuit disposed in the display area and having a plurality of signal lines and a plurality of transistors each respectively disposed between two adjacent columns of the pixels among the columns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings.

DETAILED DESCRIPTION

Reference will now be made in detail to the embodiments of the invention, examples of which are illustrated in the accompanying drawings.

Figure 2:
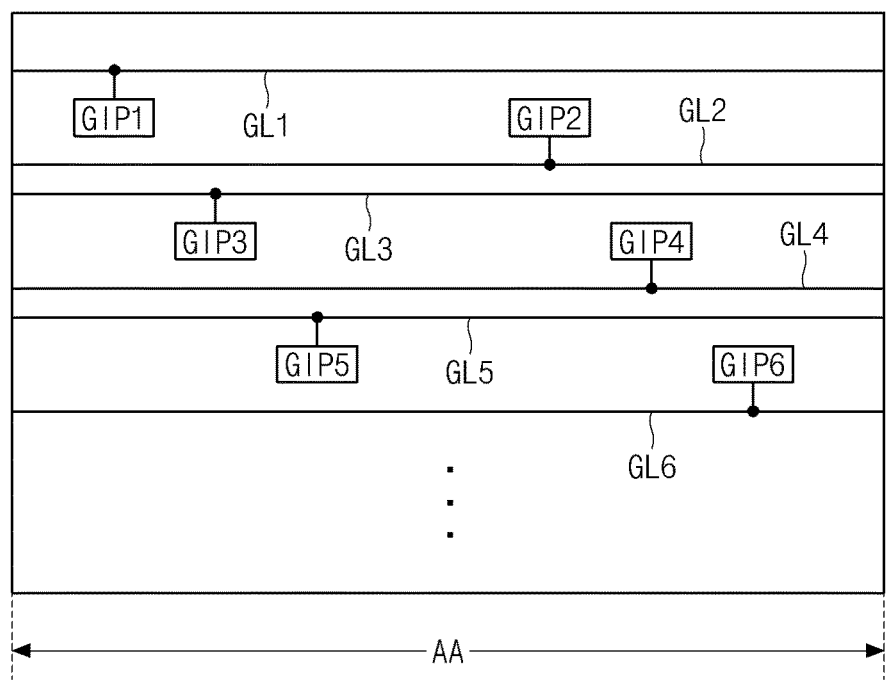
FIG. 2 is a plan view of a display panel of a GIP type display device according to an example embodiment of the present invention.

FIG. 2 is a plan view of a display panel of a GIP type display device, such as a GIP type LCD device, according to an example embodiment of the present invention. As shown FIG. 2, the display panel 100 of a GIP type display device according to the example embodiment of the present invention includes a display area AA configured to display an image and non-display areas (not shown) at outer sides of the display area AA.

More specifically, a plurality of pixels (not shown), which are defined by a plurality of gate lines GL1 to GL6 and a plurality of data lines (not shown) crossing each other, are disposed in the display area AA of the display panel 100. Particularly, a plurality of GIP circuits GIP1 to GIP6, each of which includes a plurality of signal lines (not shown) and a plurality of transistors (not shown), are disposed in the display area AA of the display panel 100.

Figure 1:
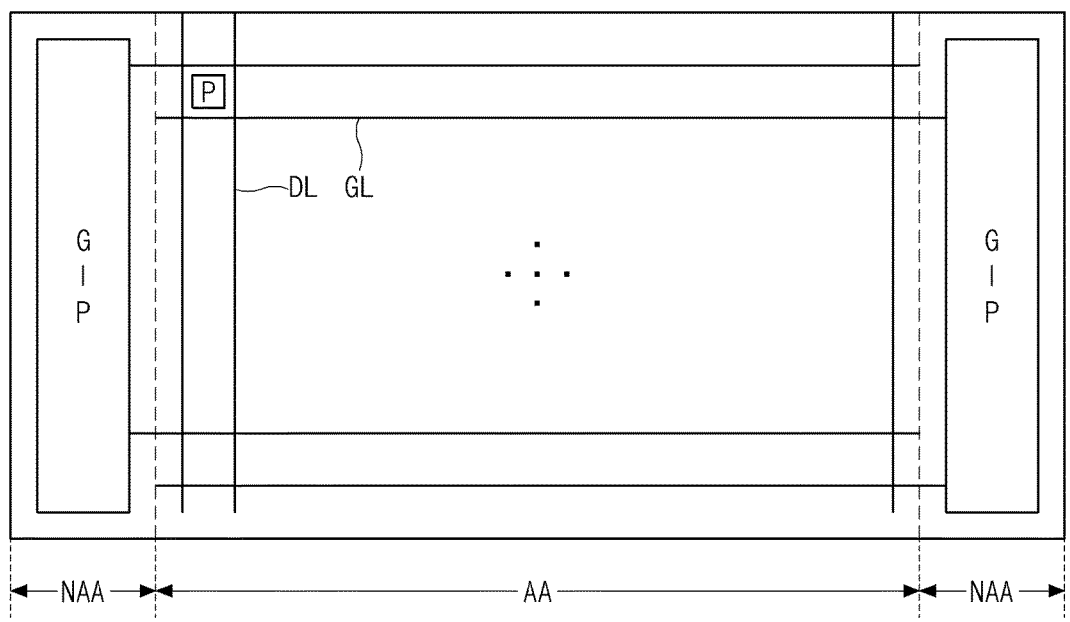
FIG. 1 is a plan view of a display panel of a related art GIP type LCD device.

In the example embodiment of the present invention, a narrower bezel can be achieved by disposing the GIP circuits GIP1 to GIP6 in the display area AA, compared to the related art LCD device shown in FIG. 1 in which the GIP circuits are disposed in the non-display areas NAA at the left and right sides of the display area AA. This will be described below in more detail.

In the display device according to the example embodiment, although more gate lines and GIP circuits may be disposed in the display area AA of the display panel 100, for convenience of explanation, six gate lines GL1 to GL6 and six GIP circuits GIP1 to GIP6 are shown in FIG. 2.

Odd-numbered GIP circuits GIP1, GIP3, and GIP5 may output gate signals to odd-numbered gate lines GL1, GL3, and GL5, respectively, and even-numbered GIP circuits GIP2, GIP4, and GIP6 may output gate signals to even-numbered gate lines GL2, GL4, and GL6, respectively.

Although not shown in the drawings, a data driving unit (not shown) may be further disposed in the non-display area (not shown), for example, at an upper or lower side of the display area AA. The data driving unit (not shown) may output data signals to the data lines (not shown) in the display area AA.

Figure 3:
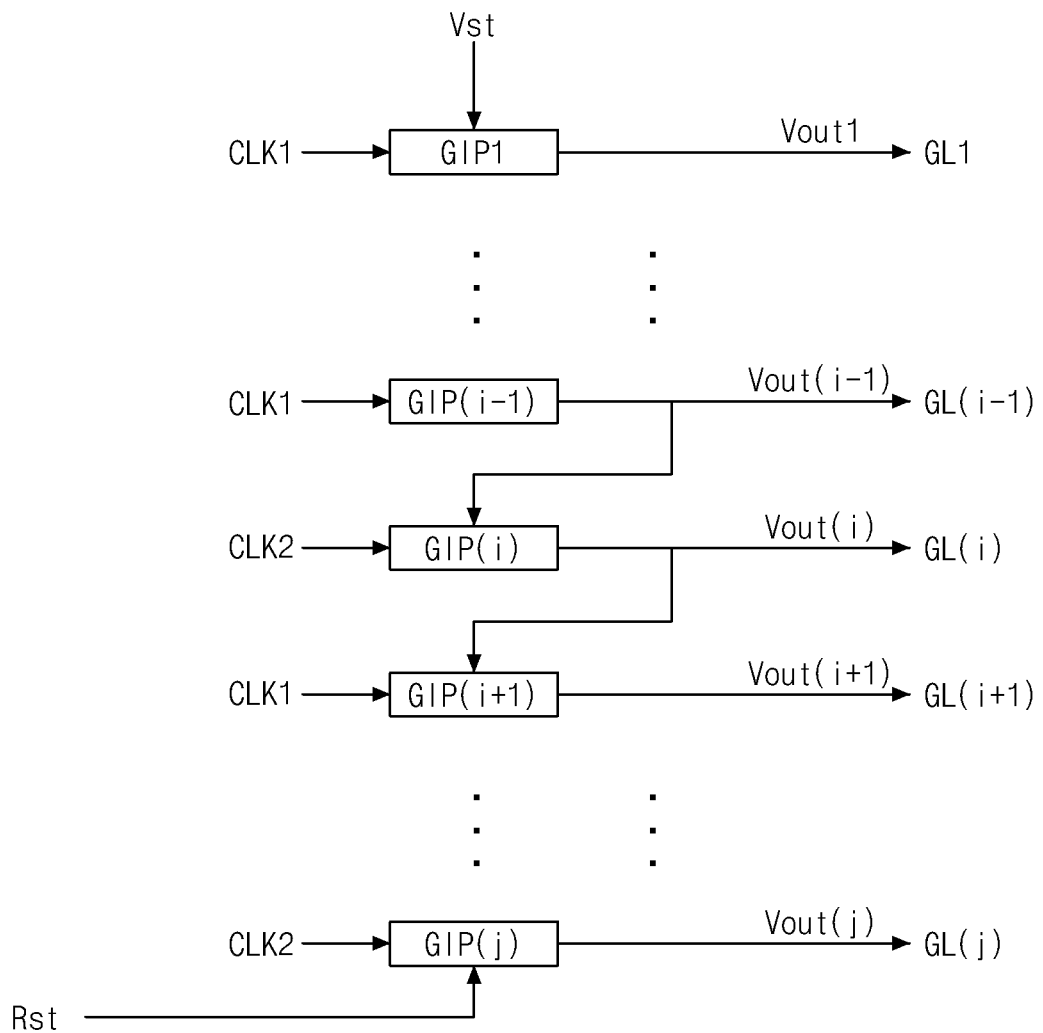
FIG. 3 is a schematic view illustrating a plurality of GIP circuits according to the example embodiment of the present invention.

FIG. 3 is a schematic view illustrating a plurality of GIP circuits according to the example embodiment of the present invention. As shown in FIG. 3, the GIP circuits GIP1, . . . , GIP(i−1), GIP(i), GIP(i+1), . . . , and GIP(j) may respectively output gate signals Vout1, . . . , Vout(i−1), Vout(i), Vout(i+1), . . . , and Vout(j), each of which has one high level pulse during a single frame, wherein i is an integer larger than 2, and j is an integer larger than 4.

The first to the j-th GIP circuits GIP1 to GIP(j) each may receive at least one of a plurality of clock signals CLK1 and CLK2, and may sequentially output the gate signals Vout1, . . . , Vout(i−1), Vout(i), Vout(i+1), . . . , and Vout(j) having the one high level pulse to the gate lines GL1, . . . , GL(i−1), GL(i), GL(i+1), . . . , and GL(j), respectively, wherein i is an integer larger than 2, and j is an integer larger than 4.

In addition, each of the clock signals CLK1 and CLK2 may partially overlap the next clock signal, and the clock signals CLK1 and CLK2 may sequentially and repeatedly be applied to the GIP circuits GIP1, . . . , GIP(i−1), GIP(i), GIP(i+1), . . . , and GIP(j). For example, each of the clock signals CLK1 and CLK2 may overlap ⅔ of a high level section of the next clock signal. Here, although two clock signals CLK1 and CLK2 are used in this example for illustrative purposes, a different number of clock signals, for example, three, four, or more, may be employed.

The gate signals Vout1, . . . , Vout(i−1), Vout(i), Vout(i+1), . . . , and Vout(j), which are respectively outputted from the GIP circuits GIP1, . . . , GIP(i−1), GIP(i), GIP(i+1), . . . , and GIP(j), are sequentially provided to the gate lines GL1, . . . , GL(i−1), GL(i), GL(i+1), . . . , and GL(j) of a display panel (not shown) to display images.

More specifically, for example, the first GIP circuit GIP1 may output the first gate signal Vout1 having the high level to the first gate line GL1, the (i−1)-th GIP circuit GIP(i−1) may output the (i−1)-th gate signal Vout(i−1) having the high level to the (i−1)-th gate line GL(i−1), the i-th GIP circuit GIP(i) may output the i-th gate signal Vout(i) having the high level to the i-th gate line GL(i), the (i+1)-th GIP circuit GIP(i+1) may output the (i+1)-th gate signal Vout(i+1) having the high level to the (i+1)-th gate line GL(i+1), and the j-th GIP circuit GIP(j) may output the j-th gate signal Vout(j) having the high level to the j-th gate line GL(j).

First, since there is no preceding GIP circuit before the first GIP circuit GIP1, the first GIP circuit GIP1 cannot receive a gate signal of the preceding GIP circuit as a starting signal to start. Thus, the first GIP circuit GIP1 may receive a start signal Vst and start.

Accordingly, the start signal Vst may be applied to the first GIP circuit GIP1, and the first GIP circuit GIP1 may then output the first gate signal Vout1 of the high level using the first clock signal CLK1. Subsequently, the (i−1)-th gate signal Vout(i−1) of the high level outputted from the (i−1)-th GIP circuit GIP(i−1) may be provided to the i-th GIP circuit GIP(i) to start the i-th GIP circuit GIP(i), and the i-th GIP circuit GIP(i) may output the i-th gate signal Vout(i) of the high level using the second clock signal CLK2. Although the second clock signal CLK2 is used in the example of FIG. 3, the first clock signal CLK1 or another clock signal may be used.

Next, the i-th gate signal Vout(i) of the high level outputted from the i-th GIP circuit GIP(i) may be provided to the (i+1)-th GIP circuit GIP(i+1) to start the (i+1)-th GIP circuit GIP(i+1), and the (i+1)-th GIP circuit GIP(i+1) may output the (i+1)-th gate signal Vout(i+1) of the high level using the first clock signal CLK1. Although the first clock signal CLK1 is used in the example of FIG. 3, the second clock signal CLK2 or another clock signal may be used instead. This process may continue sequentially until the j-th GIP circuit GIP(j) outputs the j-th gate signal Vout(j) of the high level using the second clock signal CLK2. Again, although the second clock signal CLK2 is used in the example of FIG. 3, the first clock signal CLK1 or another clock signal may be used.

When the j-th gate signal Vout(j) is outputted from the j-th GIP circuit GIP(j) where one frame ends, the j-th GIP circuit GIP(j) may receive a reset signal Rst and be initialized such that the first gate signal Vout1 may be outputted from the first GIP circuit GIP1 when the next frame starts.

Figure 4:
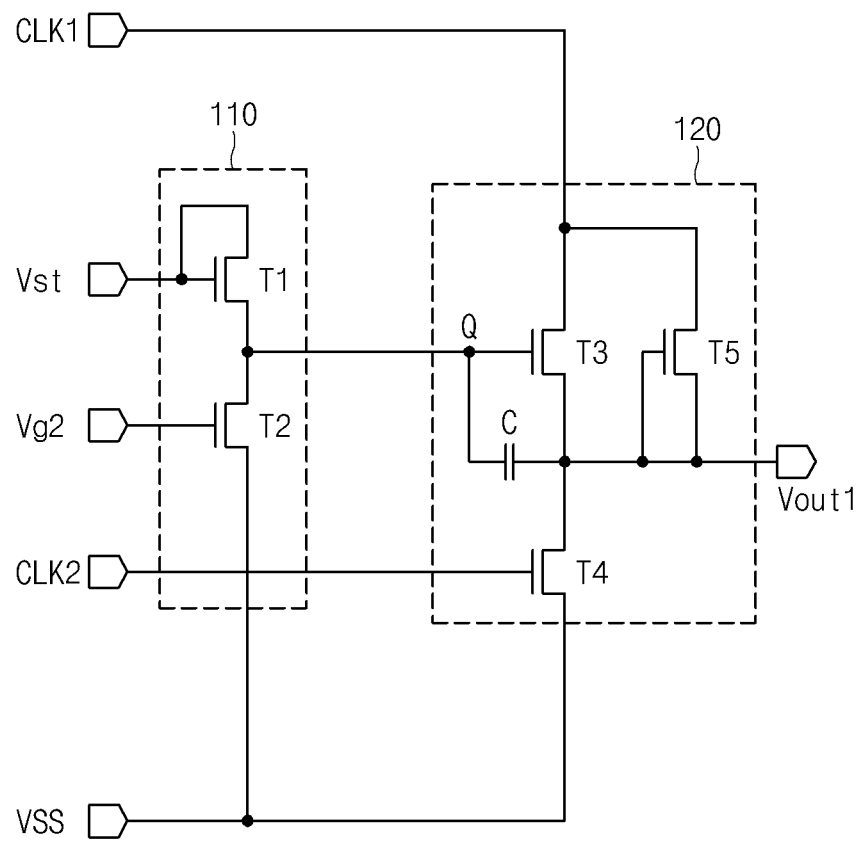
FIG. 4 is a view schematically illustrating an example of the first GIP circuit shown in FIG. 3 according to the example embodiment of the present invention.

FIG. 4 is a view schematically illustrating an example of the first GIP circuit G1P1 in FIG. 3 according to the example embodiment of the present invention. As shown in FIG. 4, the first GIP circuit GIP1 may include a control circuit 110 to control a first node Q and an output circuit 120 to output the first gate signal Vout1 corresponding to the first clock signal CLK1 depending on a voltage state at the first node Q.

Here, the control circuit 110 may control the voltage state of the first node Q such that the first gate signal Vout1 corresponding to the first clock signal CLK1 is outputted from the output circuit 120. To do this, the control circuit 110 may include a first transistor T1 connected between a start signal (Vst) input terminal and the first node Q, and a second transistor T2 connected respectively to the first node Q, a second gate signal Vg2 input terminal, and a low level voltage VSS input terminal.

Here, the drain and the gate of the first transistor T1 may be connected to each other, and the first transistor T1 may function as a diode. That is, a voltage at the drain of the first transistor T1 may be inputted to the source, but a voltage at the source may not be inputted to the drain. Therefore, the first transistor T1 may apply the start signal Vst to the first node Q and, at the same time, prevent a voltage charged at the first node Q from being discharged to the outside through the first transistor T1.

In addition, the second transistor T2 may initialize the first node Q. At this time, the second transistor T2 may be turned on by the second gate signal Vg2 and charge the first node Q with the low level voltage VSS. Accordingly, the first node Q can be charged again by the start signal Vst of a high level at the start of the next frame.

The output circuit 120 outputs the first gate signal Vout1 at a high voltage level or at a low voltage level depending on the voltage state of the first node Q. To do this, the output circuit 120 may include (a) a third transistor T3 connected to a first clock signal CLK1 input terminal, the first node Q, and a first gate signal Vout1 output terminal, (b) a fourth transistor T4 connected to a second clock signal CLK2 input terminal, the low level voltage VSS input terminal, and the source of the third transistor T3, (c) a fifth transistor T5 connected to the drain of the third transistor T3 and the first gate signal Vout1 output terminal, and (d) a capacitor C connected between the first node Q and the source of the third transistor T3.

The third transistor T3 may be turned on by a high level voltage charged at the first node Q and output the first gate signal Vout1 corresponding to a high level of the first clock signal CLK1.

Additionally, the first gate signal Vout1 may be inputted to the second GIP circuit GIP2 (not shown) as a starting signal for the second GIP circuit GIP2. Then, the second GIP circuit GIP2 may output the second gate signal Vg2. Moreover, the second gate signal Vg2 may be inputted to the second gate signal Vg2 input terminal, and the second transistor T2 may be turned on by the second gate signal Vg2, whereby the first node Q is charged by the low level voltage VSS.

Furthermore, the source and gate of the fifth transistor T5 may be connected to each other, and the fifth transistor T5 may function as a diode. Accordingly, the fifth transistor T5 may turn on if the high level of the first clock signal CLK1 is applied to the gate of the fifth transistor T5 as the third transistor T3 is turned on by a high level voltage charged at the first node Q. The fifth transistor T5 may turn off if the low level voltage VSS is applied to the gate of the fifth transistor T5.

In addition, the capacitor C may be charged by a voltage level of the start signal Vst when the start signal Vst of the high level is inputted to the gate of the first transistor T1 and the first transistor T1 turns on.

Then, when the capacitor C is charged with a voltage higher than a threshold voltage between the gate and source of the third transistor T3 and the first clock signal CLK1 is at a high level, bootstrapping occurs. A voltage larger than the high level of the start signal Vst may be charged at the first node Q, and the voltage of the first node Q may definitely be high. Thus, the third transistor T3 may turn on.

Moreover, the fourth transistor T4 may be turned on by the second clock signal CLK2 and output the low level voltage VSS to the first gate signal Vout1 output terminal. At this time, the first node Q may be charged with the low level voltage VSS by the second transistor T2 turned on by the second gate signal Vg2, the third transistor T3 may turn off, and an initialization may be accomplished.

The above processes may be repeatedly performed by the first GIP circuit GIP1 at each frame. Also, similar processes may be sequentially performed by the succeeding GIP circuits GIP2 to GIP(j), respectively, in each frame.

Figure 5:
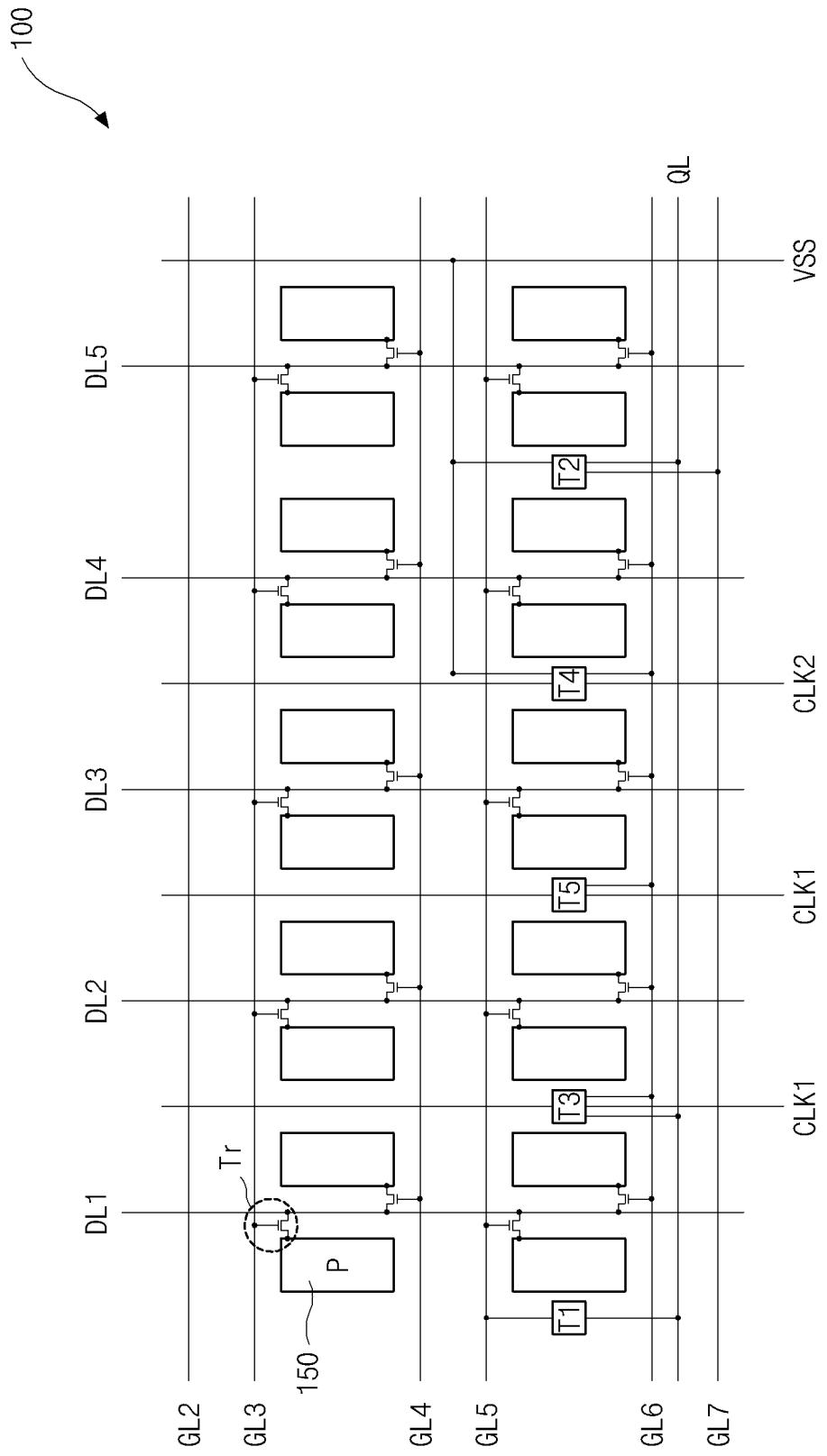
FIG. 5 is a view of a display panel including GIP circuits in a display area according to an example embodiment of the present invention.

FIG. 5 is a view of a display panel including GIP circuits in a display area according to an example embodiment of the present invention.

In the display area AA of the display panel 100, m/2 data lines (m is a positive even number) extending in a first direction and 2n gate lines (n is an integer greater than or equal to 5) extending in a second direction may cross each other to define m×n pixels, and 2n GIP circuits may be disposed. For convenience of illustration and discussion, the second to the seventh gate lines GL2 to GL7, the first to the fifth data lines DL1 to DL5, and one GIP circuit are shown in the FIG. 5. In this example, for illustrative purposes, the GIP circuit corresponds to the sixth GIP circuit GIP6 of FIG. 2, wherein i is 6. The other GIP circuits may be disposed in the display area in a similar manner.

As shown in FIG. 5, two columns of pixels may be disposed between two adjacent data lines among the first to the fifth data lines DL1 to DL5. Two of the second to the seventh gate lines GL2 to GL7 may be disposed between two adjacent rows of pixels.

In addition, each pixel may include a pixel electrode P and a thin film transistor Tr. A data signal from one of the first to the fifth data lines DL1 to DL5 may be provided to two adjacent columns of pixels, with the one of the first to the fifth data lines DL1 to DL5 therebetween.

There is no data line between the columns of two pixels disposed between two adjacent data lines among the first to the fifth data lines DL1 to DL5. As shown in FIG. 5, for example, such signal lines as CLK1, CLK2, VSS, Vst, and Rst, shown in FIGS. 3 and 4, and transistors T1 to T5, shown in FIG. 4, included in the GIP circuit may respectively be disposed between two adjacent columns of pixels where there is no data line.

Namely, the display device according to example embodiments of the present invention may utilize areas between columns of pixels where the data lines DL1 to DL5 are not disposed in the display area AA. Accordingly, since it is not necessary to provide for an additional area for such signal lines as CLK1, CLK2, VSS, Vst, and Rst of FIGS. 3 and 4, and the transistors T1 to T5 of FIG. 4 in the display area AA, a decrease in the aperture ratio of the LCD device can be prevented or mitigated.

The signal lines CLK1, CLK2, VSS, Vst, and Rst may respectively correspond to the first and second clock signal lines CLK1 and CLK2, a low level voltage line VSS, a start signal line Vst, and a reset signal line Rst, as shown for example in FIGS. 3 and 4.

In addition, the GIP circuit may further include a first node line QL, corresponding for example to node Q in FIG. 4, and a second node line (not shown), as well as additional node lines. Each of the first node line QL, the second node line, and any additional node lines may be disposed between two adjacent rows of pixels.

The signal lines CLK1, CLK2, VSS, Vst, and Rst may extend in the same first direction, and may be formed of a same material on a same layer, as the data lines DL1 to DL5.

Moreover, the first node line QL, and the second and any additional node lines may extend in the second direction, for example in the same direction as the gate lines GL2 to GL7. If the first node line QL and the second node line are spaced apart from the gate lines GL2 to GL7, the first node line QL and the second node line may be formed of the same material on the same underlying layer as the gate lines GL2 to GL7. Alternatively, if the first node line QL and the second node line overlap the gate lines GL2 to GL7, the first node line QL and the second node line may be formed of a different material on a different underlying layer from the gate lines GL2 to GL7.

Furthermore, the transistors T1 to T5 may correspond to the first to the fifth transistors T1 to T5, as shown for example in FIG. 4. More specifically, the gate and drain electrodes of the first transistor T1 may be connected to the fifth gate line GL5, and the source electrode of the first transistor T1 may be connected to the first node line QL. Accordingly, the first transistor T1 may receive a gate signal supplied from the fifth gate line GL5 as a starting signal and input it to the first node line QL.

With respect to the first GIP circuit GIP1, as shown for example in FIG. 3, there is no preceding GIP circuit. Unlike in the sixth GIP circuit GIP6, shown for example in FIG. 5, the first transistor T1 of the first GIP circuit GIP1 of FIG. 3 cannot receive a gate signal outputted from the preceding GIP circuit as a starting signal to start. Thus, the gate electrode of the first transistor T1 of the first GIP circuit GIP1 of FIG. 3 may be connected to the start signal line Vst of FIG. 3 and receive a start signal supplied from the start signal line Vst of FIG. 3 to start.

In addition, as in the first GIP circuit GIP1, the gate and drain electrodes of the first transistor T1 of the sixth GIP circuit GIP6 may be connected to each other, and the first transistor T1 may function as a diode. Accordingly, a voltage charged at the first node line QL is prevented from being discharged to the outside through the first transistor T1.

Moreover, a drain electrode of the second transistor T2 may be connected to the first node line QL, a source electrode of the second transistor T2 may be connected to the low level voltage line VSS, and a gate electrode of the second transistor T2 may be connected to the seventh gate line GL7. Accordingly, the second transistor T2 may be turned on by a gate signal supplied from the seventh gate line GL7 and input a low level voltage supplied from the low level voltage line VSS to the first node line QL. In this manner, the GIP circuit may be prepared for the next frame by having the first node line QL charged with the low level voltage.

Additionally, a source electrode of the third transistor T3 may be connected to the sixth gate line GL6, a drain electrode of the third transistor T3 may be connected to the first clock signal line CLK1, and a gate electrode of the third transistor T3 may be connected to the first node line QL. Accordingly, the third transistor T3 may be turned on by a high level voltage charged at the first node line QL and output a gate signal corresponding to the clock signal supplied from the first clock signal line CLK1 to the sixth gate line GL6.

As discussed above, if the first node line QL is charged with the low level voltage by the second transistor T2 turning on, the third transistor T3 turns on, and the initialization may be accomplished.

In addition, a gate electrode of the fourth transistor T4 may be connected to the second clock signal line CLK2, a source electrode of the forth transistor T4 may be connected to the low level voltage line VSS, and a drain electrode of the fourth transistor T4 may be connected to the sixth gate line GL6 and the source electrode of the third transistor T3. Accordingly, the fourth transistor T4 may be turned on by a clock signal supplied from the second clock signal line CLK2 and output the low level voltage supplied from the low level voltage line VSS to the sixth gate line GL6.

Moreover, a drain electrode of the fifth transistor T5 may be connected to the first clock signal line CLK1, and a gate electrode and a source electrode of the fifth transistor T5 may each be connected to the sixth gate line GL6 and the source electrode of the third transistor T3. Accordingly, the fifth transistor T5 may be turned on by a clock signal supplied from the first clock signal line CLK1 and output a gate signal corresponding to the clock signal to the sixth gate line GL6. The fifth transistor T5 may be turned off by the low level voltage supplied from the low level voltage line VSS and output the low level voltage to the sixth gate line GL6.

The gate and source electrodes of the fifth transistor T5 may be connected to each other, and the fifth transistor T5 may function as a diode.

Although, for convenience of illustration and discussion, an example of the sixth GIP circuit GIP6 disposed in the display area AA and configured to output a gate signal to the sixth gate line GL6 is discussed above, other GIP circuits may output gate signals to the respective gate lines in substantially the same manner as discussed above.

Hereinafter, example arrangement structures and connection relations of the first to the fifth transistors T1 to T5, the signal lines CLK1, CLK2, and VSS connected to the first to the fifth transistors T1 to T5, and the first node line QL will be explained with reference to FIG. 5.

First, since the sixth GIP circuit GIP6 is configured to output a gate signal to the sixth gate line GL6, the first to the fifth transistors T1 to T5 (for example as shown in FIG. 3) of the sixth GIP circuit GIP6 may be disposed between the fifth gate line GL5 and the sixth gate line GL6.

For example, the first transistor T1 may be disposed at the left side of the first column of pixels connected to the first data line DL1, the second transistor T2 may be disposed between two adjacent pixels in the row direction located between the fourth and the fifth data lines DL4 and DL5, the third transistor T3 may be disposed between the two adjacent pixels in the row direction located between the first and the second data lines DL1 and DL2, the fourth transistor T4 may be disposed between the two adjacent pixels in the row direction located between the third and the fourth data lines DL3 and DL4, and the fifth transistor T5 may be disposed between the two adjacent pixels in the row direction located between the second and the third data lines DL2 and DL3. The first to the fifth transistors T1 to T5 may be disposed at different locations within the display area AA, for example between two adjacent pixels in the row direction where no data line is disposed.

Also for example, the first clock signal line CLK1 may be disposed between the two columns of pixels located between the first and the second data lines DL1 and DL2, and also between the two columns of pixels located between the second and the third data lines DL2 and DL3. The first clock signal line CLK1 may be disposed at different locations within the display area AA, for example between two columns of pixels where no data line is disposed. The first clock signal line CLK1 may be connected to the third and the fifth transistors T3 and T5.

Moreover, the second clock signal line CLK2 may be disposed between the two columns of pixels located between the third and the fourth data lines DL3 and DL4, and may be connected to the fourth transistor T4. The second clock signal line CLK2 may be disposed at different locations within the display area AA, for example between two columns of pixels where no data line is disposed.

Furthermore, the low level voltage line VSS may be disposed at the right side of the pixel column located at the right side of the fifth data line DL5. The low level voltage line VSS may be disposed at different locations within the display area AA, for example between two columns of pixels where no data line is disposed. The low level voltage line VSS may extend parallel to and between the fourth and the fifth gate lines GL4 and GL5, and may be connected to the second and the fourth transistors T2 and T4.

Additionally, the first node line QL may be disposed parallel to and between the sixth and the seventh gate lines GL6 and GL7, and may be connected to the first, second, and third transistors T1, T2, and T3.

In the above example embodiment, two clock signals are used. However, the number of the clock signals is not limited to this example, and additional clock signals may be employed.

In addition, the gate line from which the first transistor T1 receives the starting signal and the gate line from which the second transistor T2 receives the gate signal to turn on may be changed. For example, when eight clock signals are used, the first transistor T1 may receive the starting signal from the (i−4)-th gate line GL(i−4), and the second transistor T2 may receive the gate signal of the (i+4)-th gate line GL(i+4) to turn on. That is, if i is 6, the gate electrode of the first transistor T1 may be connected to the second gate line GL2, and the gate electrode of the second transistor T2 may be connected to the tenth gate line GL10.

The gate electrode of the first transistor T1 of each of the first to the fourth GIP circuits GIP1 to GIP4 may be connected to the start signal line Vst, for example as shown in FIG. 3. The gate electrode of the second transistor T2 of each of the (j−3)-th to the j-th GIP circuits GIP(j−3) to GIP(j) may be connected to the reset signal line Rst, for example as shown in FIG. 3.

In the manner discussed above in connection with example embodiments, a narrow bezel can be implemented in a display device by disposing such signal lines as CLK1, CLK2, VSS, Vst, and Rst (as shown for example in FIGS. 3 and 4) and the transistors T1 to T5 of the GIP circuits (as shown for example in FIG. 4) in the display area AA, instead of the non-display areas NAA at the left and right sides of the display area AA shown in FIG. 1.

In addition, since the signal lines CLK1, CLK2, VSS, Vst, and Rst, and the transistors T1 to T5 of the GIP circuits may be formed concurrently from the same respective materials on the same respective underlying layers as the data lines DL1 to DL5, the gate lines GL2 and GL7, and the thin film transistors Tr of the pixels, the manufacturing processes may be simplified, and the manufacturing costs may be lowered.

It will be apparent to those skilled in the art that various modifications and variations can be made in the display device of the present invention without departing from the spirit or scope of the invention. Thus, it is intended that the present invention cover the modifications and variations of this invention provided they come within the scope of the appended claims and their equivalents.

What is claimed is:

1. A display device, comprising:
a display panel including a display area and a non-display area, the display panel including in the display area:
m/2 data lines extending in a first direction, m being a positive even number;
2n gate lines extending in a second direction and crossing the data lines, n being an integer greater than or equal to 5; and
a plurality of pixels defined by the data lines and the gate lines, and arranged in n rows and m columns; and
at least one gate in panel (GIP) circuit disposed in the display area and having a plurality of signal lines and a plurality of transistors each respectively disposed between two adjacent columns of the pixels among the m columns,
wherein a first GIP circuit among the at least one GIP circuit is configured to output a gate signal to a first gate line, the first GIP circuit including:
a first transistor connected to a start signal line and a first node line;
a second transistor connected to the first node line and a low level voltage line;
a third transistor connected to a first clock signal line and the first node line;
a fourth transistor connected to a second clock signal line, the low level voltage line, and the third transistor; and
a fifth transistor connected to the first clock signal line and the third transistor, wherein a gate electrode and a source electrode of the fifth transistor are connected to each other.

2. The display device of claim 1, wherein two of the gate lines are disposed between two adjacent rows of the pixels among the n rows, and
wherein two of the columns of pixels are disposed between two adjacent data lines among the data lines.

3. The display device of claim 1, wherein odd-numbered GIP circuits among the at least one GIP circuit are configured to output gate signals to odd-numbered gate lines among the gate lines, and even-numbered GIP circuits among the at least one GIP circuit are configured to output gate signals to even-numbered gate lines among the gate lines.

4. The display device of claim 1, wherein the signal lines extend in the first direction and are disposed on a same underlying layer as the data lines.

5. The display device of claim 1, wherein the signal lines include one or more of:
the first and second clock signal lines, the start signal line, a reset signal line, and the low level voltage line.

6. The display device of claim 5, wherein the first GIP circuit further includes the first node line and a second node line disposed between two adjacent rows of pixels among the n rows.

7. The display device of claim 6, wherein the first and the second node lines extend in the second direction, are spaced apart from the gate lines, and are disposed on a same underlying layer as the gate lines.

8. The display device of claim 6, wherein at least one of the first and the second node lines overlaps one of the gate lines in plan view and is disposed on a different underlying layer from the gate lines.

9. The display device of claim 1, further comprising a data driving circuit disposed in the non-display area and configured to output data signals to the data lines.

10. The display device of claim 1, wherein a drain electrode of the fifth transistor is connected to the first clock signal line, and the gate and source electrodes of the fifth transistor are connected to a source electrode of the third transistor.

11. A display device, comprising:
a display panel having a display area configured to display an image, the display panel including in the display area:
a plurality of data lines extending in a first direction;
a plurality of gate lines extending in a second direction and crossing the data lines; and a plurality of pixels defined by the data lines and the gate lines, and arranged in a plurality of rows and a plurality of columns; and at least one gate in panel (GIP) circuit disposed in the display area and having a plurality of signal lines and a plurality of transistors each respectively disposed between two adjacent columns of the pixels among the columns, wherein a first GIP circuit among the at least one GIP circuit is configured to output a gate signal to a first gate line, the first GIP circuit including:

a first transistor connected to a start signal line and a first node line;

a second transistor connected to the first node line and a low level voltage line;

a third transistor connected to a first clock signal line and the first node line;

a fourth transistor connected to a second clock signal line, the low level voltage line, and the third transistor; and a fifth transistor connected to the first clock signal line and the third transistor, wherein a gate electrode and a source electrode of the fifth transistor are connected to each other.

12. The display device of claim 11, wherein the display panel further includes a non-display area outside the display area, and wherein the display device further comprises a data driving circuit disposed in the non-display area and configured to output data signals to the data lines.

13. The display device of claim 11, wherein two of the gate lines are disposed between two adjacent rows of the pixels among the rows, and wherein two of the columns of pixels are disposed between two adjacent data lines among the data lines.

14. The display device of claim 11, wherein the signal lines extend in the first direction and are disposed on a same underlying layer as the data lines.

15. The display device of claim 11, wherein the signal lines include one or more of:

the first and second clock signal lines, the start signal line, a reset signal line, and the low level voltage line, and wherein the first GIP circuit further includes the first node line and a second node line disposed between two adjacent rows of pixels among the rows.

16. The display device of claim 15, wherein the first and the second node lines extend in the second direction, are spaced apart from the gate lines, and are disposed on a same underlying layer as the gate lines.

17. The display device of claim 15, wherein at least one of the first and the second node lines overlaps one of the gate lines in plan view and is disposed on a different underlying layer from the gate lines.

18. The display device of claim 11, further comprising a plurality of GIP circuits each disposed in the display area and configured to output a gate signal to a respective one of the gate lines sequentially.

19. The display device of claim 11, wherein the first GIP circuit is configured to output the gate signal to the first gate lines to activate one of the rows of pixels.

20. The display device of claim 11, wherein a drain electrode of the fifth transistor is connected to the first clock signal line, and the gate and source electrodes of the fifth transistor are connected to a source electrode of the third transistor.

* * * * *